(12) United States Patent
Saito et al.

(10) Patent No.: US 11,395,447 B2
(45) Date of Patent: Jul. 19, 2022

(54) TAPE FEEDER

(71) Applicant: FUJI CORPORATION, Chiryu (JP)

(72) Inventors: Shigeo Saito, Toyota (JP); Itaru Soga, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 477 days.

(21) Appl. No.: 15/124,975

(22) PCT Filed: Mar. 10, 2014

(86) PCT No.: PCT/JP2014/056190
§ 371 (c)(1),
(2) Date: Sep. 9, 2016

(87) PCT Pub. No.: WO2015/136600
PCT Pub. Date: Sep. 17, 2015

(65) Prior Publication Data
US 2017/0020039 A1    Jan. 19, 2017

(51) Int. Cl.
*H05K 13/02* (2006.01)
*H05K 13/04* (2006.01)

(52) U.S. Cl.
CPC ....... *H05K 13/023* (2013.01); *H05K 13/0421* (2013.01)

(58) Field of Classification Search
CPC ............. H05K 13/023; H05K 13/0421; H05K 13/0426; H05K 13/02; H05K 13/0417; Y10T 29/4914; Y10T 29/515; Y10T 29/49135
See application file for complete search history.

(56) References Cited

U.S. PATENT DOCUMENTS

| 3,907,008 A | 9/1975 | Bates et al. | |
| 4,177,549 A | * 12/1979 | Mori | H05K 13/0408 29/564.2 |
| 4,757,600 A | * 7/1988 | Holcomb | H05K 13/0092 29/564.6 |
| 5,777,886 A | 7/1998 | Glucksman et al. | |

FOREIGN PATENT DOCUMENTS

| JP | 2-52500 A | 2/1990 |
| JP | 02052500 A * | 2/1990 |
| JP | 3-218099 A | 9/1991 |

(Continued)

OTHER PUBLICATIONS

Machine translation of JP02-052500A, Ueno et al. translated on Apr. 1, 2019, pp. 1-4. (Year: 2019).*

(Continued)

*Primary Examiner* — Teresa M Ekiert
(74) *Attorney, Agent, or Firm* — Oblon, McClelland, Maier & Neustadt, L.L.P.

(57) ABSTRACT

A bending device is provided in a tape feeder. In the bending device, lead wires of a bending target lead component that has reached a bending position of lead component tape fed by a feeding device are bent. In addition, as the lead wires are cut by a cutting device, bent lead components are separated from a carrier tape, and the bent lead components are supplied one by one. In this manner, in the tape feeder, as the lead wires of the lead component tape are bent, the bent lead components are supplied.

13 Claims, 10 Drawing Sheets

(56) References Cited

FOREIGN PATENT DOCUMENTS

| | | |
|---|---|---|
| JP | 5-63396 A | 3/1993 |
| JP | 7-221492 A | 8/1995 |
| JP | 2672342 B2 | 11/1997 |

OTHER PUBLICATIONS

International Search Report dated Apr. 28, 2014 in PCT/JP2014/056190 Filed Mar. 10, 2014.
Extended European Search Report dated Sep. 25, 2017 in Patent Application No. 14885191.8.

\* cited by examiner

FIG. 3
(a)
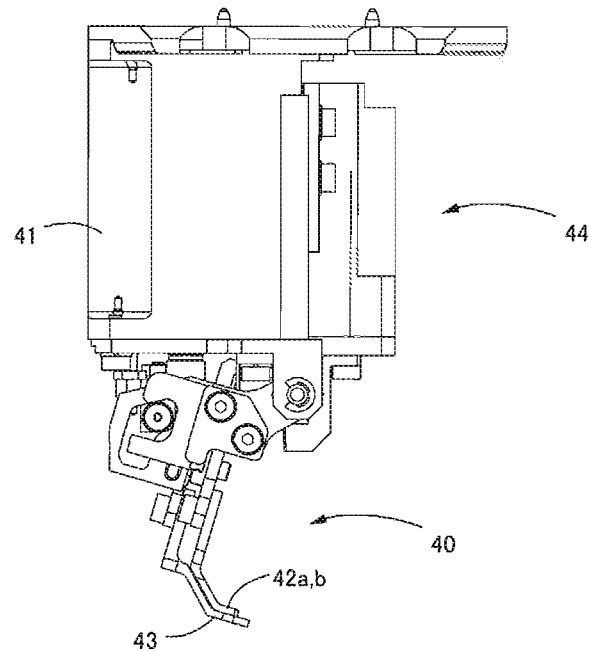
(b)
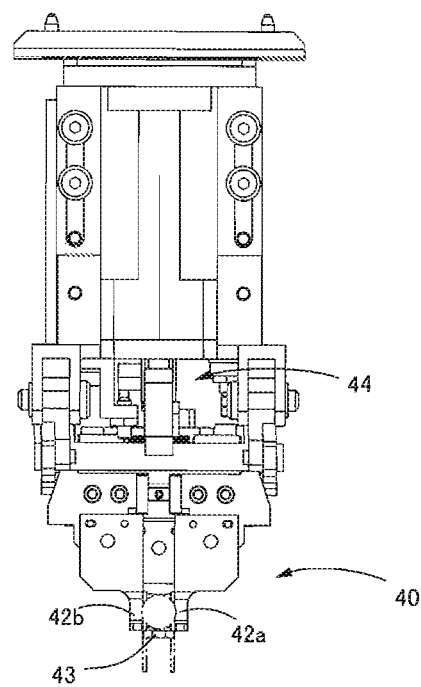

FIG. 8 (a) (b) (c)
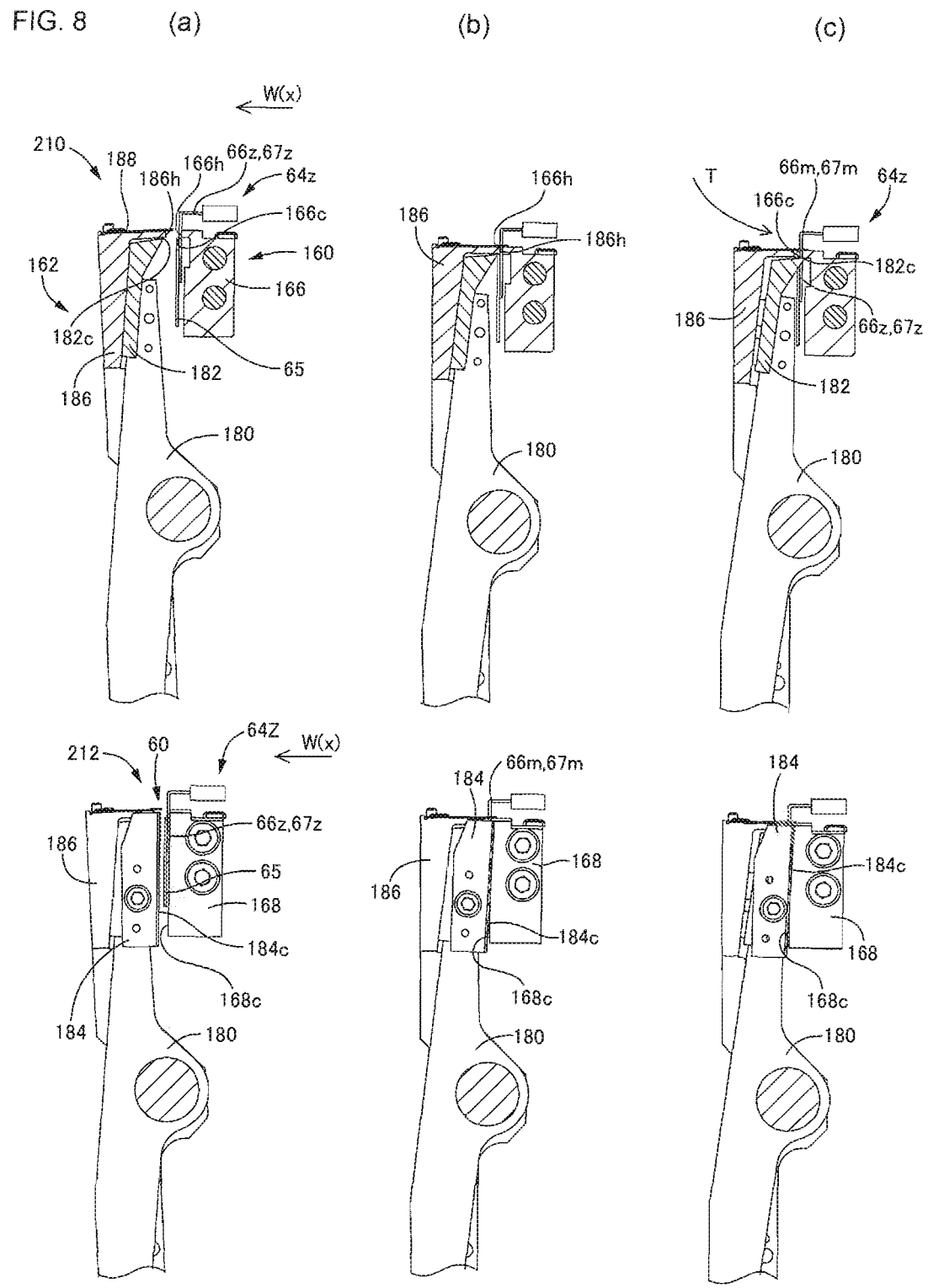

FIG. 9
(a)
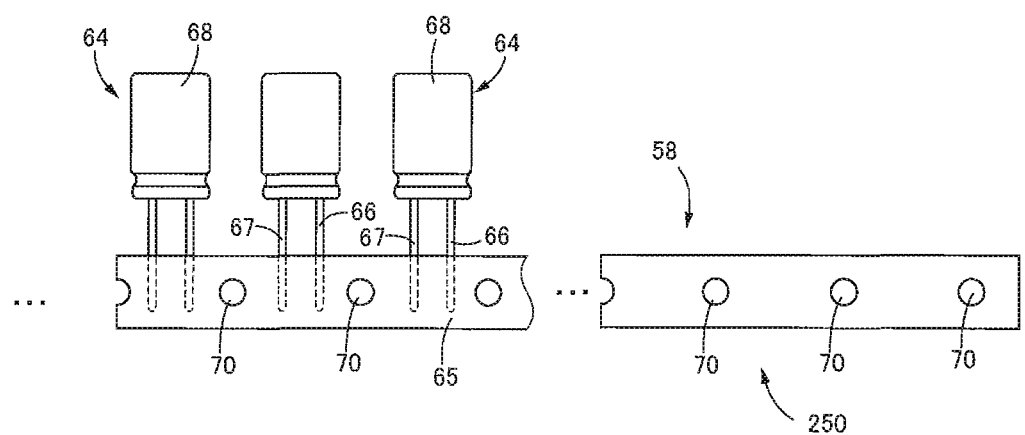
(b)
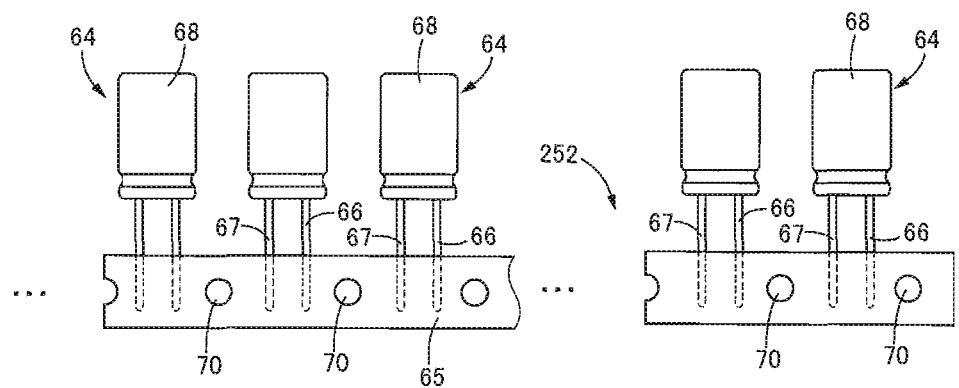

FIG. 10 (a)
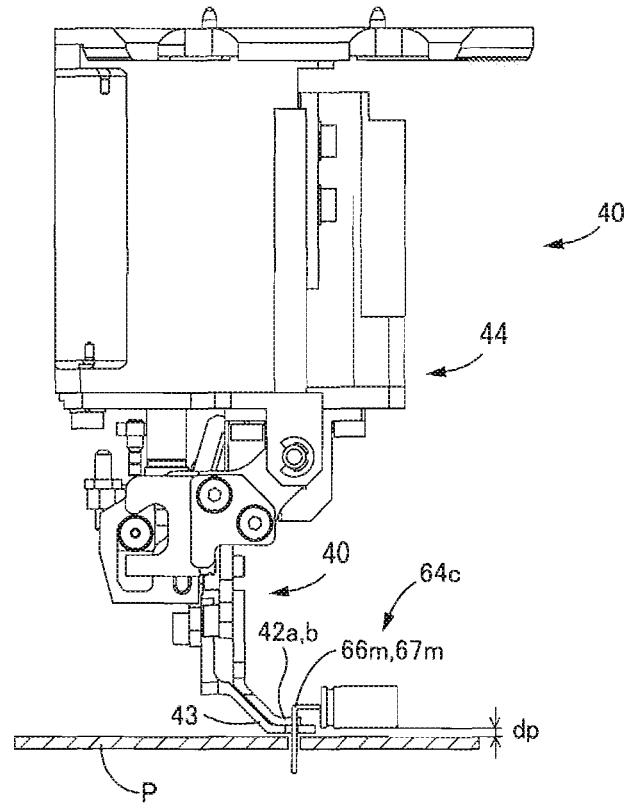
(b)
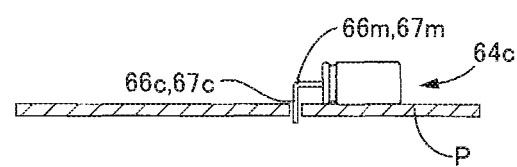

TAPE FEEDER

TECHNICAL FIELD

The present application relates to a tape feeder that supplies lead components.

BACKGROUND ART

In PTL 1, a forming machine that supplies bent lead components by bending and cutting two lead wires of radial lead component tape is described. In the forming machine, a bending device including a fixing section and a movable section provided with a movable cutter and a bending member which are separated from each other is provided, and two lead wires are bent and cut as the movable section approaches the fixing section. In PTL 2, a tape feeder that supplies radial lead components having two lead wires that extend in a straight line is described. The tape feeder includes (i) a feeding device that sends radially taped electronic components along a guide groove, (ii) a bending device that bends the lead wire of the radial lead component by moving a bending member of the guide groove in the width direction along an opening surface of the guide groove, and (iii) a cutting device that cuts two lead wires at a portion further on the component main body side than the bent portion.

CITATION LIST

Patent Literature

PTL 1: JP-A-3-218099
PTL 2: JP-A-2-52500

SUMMARY

An object of the present disclosure is to improve a tape feeder, for example, to make it possible to easily supply bent lead components.

A tape feeder according to the present disclosure is capable of supplying bent lead components. When attaching lead component tape, the bent lead components are automatically supplied, and the bent lead components can be easily supplied.

Hereinafter, aspects of the disclosure will be described.

(1) A tape feeder that supplies bent lead components, including: a feeding device that feeds a lead component tape; a bending device that bends multiple lead wires of a bending target lead component, which is the lead component that has reached a bending position, as the lead component tape is fed by the feeding device; and a cutting device that cuts the multiple lead wires of a cutting target lead component, which is the lead component that has reached a cutting position, as the taped lead component is fed by the feeding device.

The bent lead component is a lead component including multiple bent lead wires.

In the tape feeder, the bending position and the cutting position may be at the same position in the feeding direction of the lead component tape or may be at positions different from each other.

(2) The tape feeder according to (1), in which the cutting position is positioned on the downstream side of the bending position, in which the lead component tape includes one component main body integrated with the multiple lead wires, and in which the cutting device includes (i) a cutting section that cuts each of the multiple lead wires of the cutting target lead component at a portion further away from the component main body than a portion bent by the bending device, and (ii) a holding section that holds the multiple lead wires of the cutting target lead component at a portion closer to the component main body than a portion cut by the cutting section.

(3) The tape feeder according to (1) or (2), in which the lead component includes one component main body integrated with the multiple lead wires, and in which the bending device includes a fixing section and a movable section provided to be capable of approaching and being separated from the fixing section, the movable section including (i) a movable side holding member that holds the multiple lead wires of the bending target lead component by gripping the lead wires together with the fixing section, and (ii) a bending member that bends the multiple lead wires of the bending target lead component at a portion on the one component main body side opposing the movable side holding member, along the fixing section.

(4) The tape feeder according to any one of (1) to (3), in which the feeding device includes a guide groove that is provided in a feeder main body and guides the lead component tape, in which the bending device includes a fixing section fixedly provided on one side of the guide groove of the feeder main body, and a movable section provided on the other side of the guide groove of the feeder main body to be capable of approaching and being separated from the fixing section, in which the fixing section includes (i) a fixing side opposing surface that opposes the guide groove, and (ii) a fixing side receiving surface that extends from the fixing side opposing surface away from the guide groove, and is inclined with respect to the fixing side opposing surface, and in which the movable section includes (a) a movable side opposing surface that opposes the fixing side opposing surface, and (b) a bent surface that extends parallel to the fixing receiving surface.

The multiple lead wires of the bending target lead component are bent by an angle determined by the fixing side opposing surface and the fixing side receiving surface, that is, by an angle determined by the movable side opposing surface and the bent surface.

(5) The tape feeder according to (4), in which the fixing side receiving surface is provided to be substantially orthogonal to the fixing side opposing surface, and the bent surface is provided to be substantially orthogonal to the movable side opposing surface, and to protrude further to the guide groove side than the movable side opposing surface.

Accordingly, the multiple lead wires of the bending target lead component are bent substantially at a right angle.

(6) The tape feeder according to any one of (1) to (5), further including: an inspection device that inspects whether the multiple lead wires of an inspection target lead component, which is a lead component that has reached the bending position or an inspection position further on the downstream side than the bending position, are bent, as the lead component tape is fed by the feeding device.

The inspection position may be the same position as the bending position, or may be a position further on the downstream side than the bending position. There are cases where the inspection position and the position at which the inspection device is provided are the same as each other, and there are cases where the positions are different from each other.

(7) The tape feeder according to any one of (1) to (6), in which the lead component tape includes at least one carrier tape in which multiple feeding holes are formed at a constant pitch in the longitudinal direction, and in which the feeding device includes two feeding mechanisms that are respectively provided further on the upstream side and on the downstream side than the bending position, and the two feeding mechanisms respectively include at least one feeding claw that is respectively engageable with at least one of the multiple feeding holes formed in the at least one carrier tape.

(8) The tape feeder according to (7), in which the feeding device includes a driving device which is shared by the two feeding mechanisms.

The two feeding mechanisms may be driven by the shared driving device, or may be driven by individual dedicated driving devices.

(9) The tape feeder according to any one of (1) to (8), further including a feeder main body that holds the feeding device, the bending device, and the cutting device, in which the feeder main body includes at least one engaging section which is engageable with an electronic circuit assembly apparatus.

The tape feeder can be attached to and detached from the electronic circuit assembly apparatus, and can be easily attached and detached by using the engaging section. In addition, the tape feeder may be directly attached to the main body of the electronic circuit assembly apparatus, or may be attached to the main body via a wheeled table.

(10) A tape feeder, in which a bent lead component is supplied by bending and cutting multiple lead wires of each of multiple of the lead components included in lead component tape.

In the tape feeder of (10), it is possible to employ technical characteristics according to any of (1) to (9).

(11) A bent lead component supply device that supplies bent lead components by bending and cutting multiple lead wires of each of multiple lead components included in lead component tape, including: a device main body provided with a guide groove that guides the lead component tape; and a bending device including a fixing section provided to be fixed on one side of the guide groove of the device main body, and a movable section provided to be capable of approaching and being separated from the fixing section on the other side of the guide groove of the device main body, in which the fixing section includes (i) a fixing side opposing surface that opposes the guide groove, and (ii) a fixing side receiving surface that extends from the fixing side opposing surface away from the guide groove, and intersects the fixing side opposing surface, and in which the movable section includes (a) a movable side opposing surface that opposes the fixing side opposing surface, and (b) a movable side bent surface which is parallel to the fixing side receiving surface.

In the bent lead component supply device of (11), it is possible to employ characteristics according to any of (1) to (10).

BRIEF DESCRIPTION OF DRAWINGS

FIG. 3(a) is a side view of a chuck or the like attached to a work head of the component insertion device. FIG. 3(b) is a front view of the chuck or the like.

FIGS. 8(a) to 8(c) are operation views of a cutting device of the tape feeder.

FIG. 9(a) is a front view of lead component tape used in the tape feeder. FIG. 9(b) is a front view illustrating different lead component tape.

FIG. 10 (a) is a view (partially sectional view) illustrating a state where a bent lead component is gripped by an insertion head of the component insertion device. FIG. 10(b) is a view (partially sectional view) illustrating a state where the bent lead component is mounted on a board.

DESCRIPTION OF EMBODIMENTS

Figure 1:
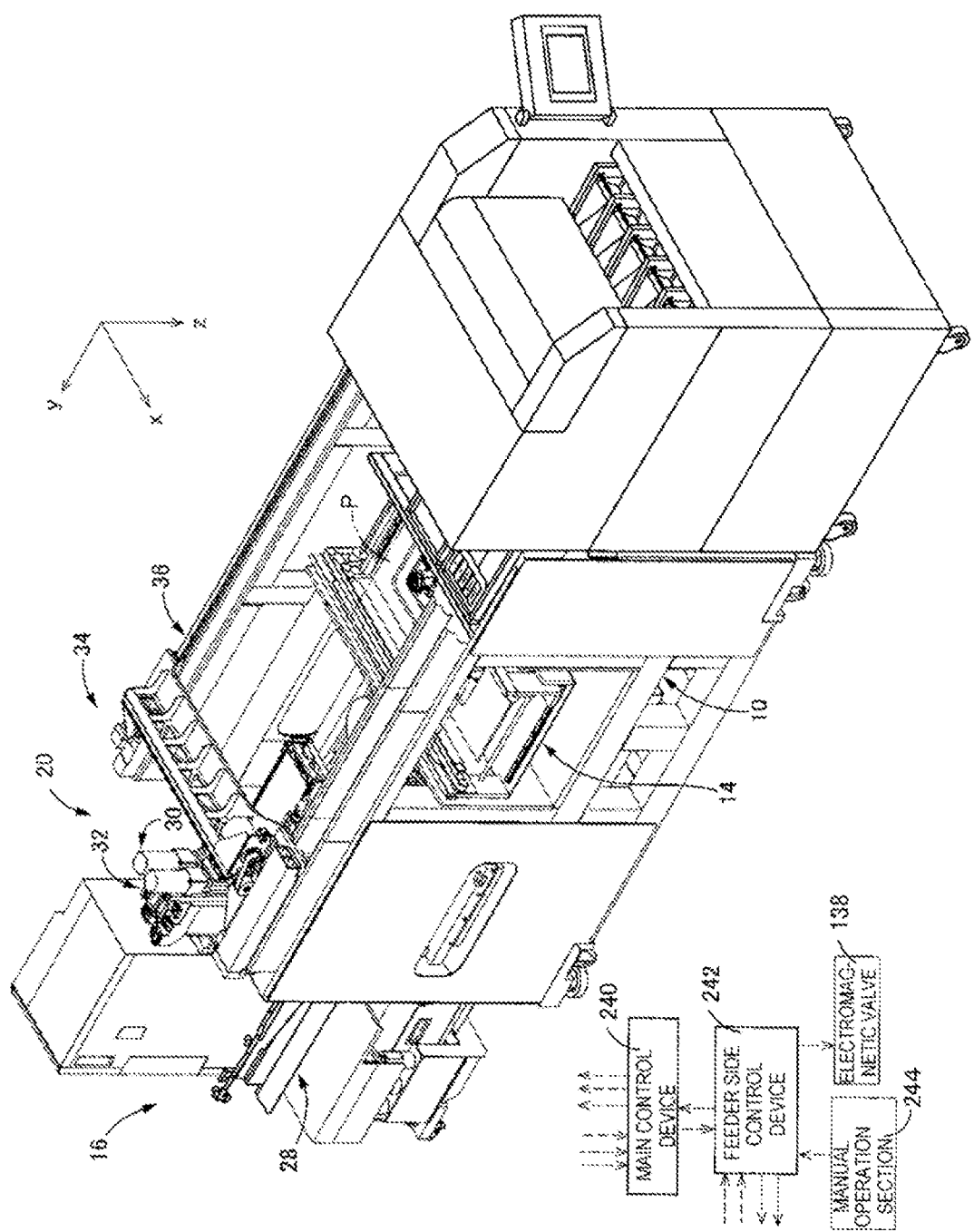
FIG. 1 is a perspective view illustrating an electronic circuit assembly apparatus including a component supply device provided with a tape feeder according to one embodiment of the present invention.

In FIG. 1, an electronic circuit assembly apparatus which is a type of automated assembly apparatus is illustrated. The electronic circuit assembly apparatus includes (i) assembly apparatus main body 10, (ii) board conveying and holding device 14, (iii) component supply device 16, and (iv) component insertion device 20.

Board conveying and holding device 14 conveys and holds circuit board P (hereinafter, referred to as board P) in a horizontal posture. In FIG. 1, x is the conveyance direction of board P by the board conveying and holding device 14, y is the width direction of board P, and z is the thickness direction of board P, that is, the vertical direction of the electronic circuit assembly apparatus. The x-direction, the y-direction, and the z-direction are orthogonal to each other.

Component supply device 16 supplies lead components to be mounted on board P, and includes multiple tape feeders 28 (one tape feeder 28 is described as a representative example in FIG. 1) or the like. Tape feeder 28 will be described later.

Figure 2:
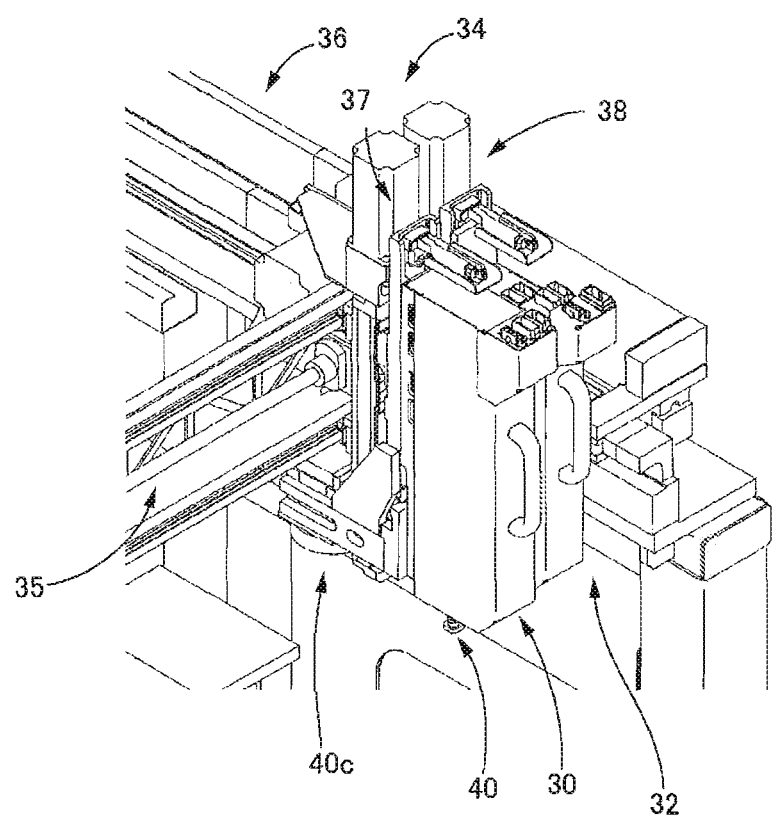
FIG. 2 is a perspective view illustrating a component insertion device included in the electronic circuit assembly apparatus.

Component insertion device 20 receives the lead components supplied in component supply device 16, and inserts the lead components into an opening formed at a position determined in advance of board P held by board conveying and holding device 14. As illustrated in FIG. 2, component insertion device 20 includes two work heads 30 and 32 and work head moving device 34. Work head moving device 34 includes x-direction moving device 35, y-direction moving device 36, and z-direction moving devices 37 and 38. Work heads 30 and 32 can be integrally moved to any position in a horizontal plane by x-direction moving device 35 and y-direction moving device 36, and can be independently moved in the z-direction respectively by z-direction moving devices 37 and 38.

Work heads 30 and 32 may, for example, be provided respectively with chuck 40 illustrated in FIGS. 3(a) and 3(b). Chuck 40 grips lead wires of the lead component, and is held to be oscillatable by chuck holding section 41. Chuck 40 includes (a) pair of claws 42a and 42b that can approach and be separated from each other, and (b) auxiliary plate 43 that is positioned between the pair of claws 42a and 42b. Pair of claws 42a and 42b can be opened and closed by a driving source, such as an air cylinder. In addition, a recessed section that corresponds to the diameter of lead wires of the lead component which are to be gripped is formed on the inner side of claws 42a and 42b. As illustrated in FIG. 3(b), auxiliary plate 43 is positioned between two lead wires of the lead component which are to be gripped, and each of the two lead wires is respectively held from the inside and the outside by auxiliary plate 43 and claws 42a and 42b (recessed section). The width of auxiliary plate 43 corresponds to the interval of the lead wires of the lead component which are to be gripped, and the tip end of auxiliary plate 43 has a tapered shape. As the tip end is tapered, auxiliary plate 43 goes between the two lead wires easily. Auxiliary plate 43 can be attached and detached, and is replaced in accordance with the interval or the like of the lead wires of the lead component which are to be gripped. In addition, pusher 45 which can be raised and lowered is attached to chuck holding section 41. Pusher 45 pushes a component main body from above after the lead wire has been inserted into the opening of board P.

In this manner, work heads 30 and 32 provided with chuck 40 can be referred to as an insertion head and a component holding head. In addition, work heads 30 and 32 may be heads that perform the same work, or may be heads that perform different types of work. For example, it is possible to set one of work heads 30 and 32 to be an insertion head or a component mounting head, and the other one to be an application head provided with a dispenser that performs coating with an adhesive. In addition, reference numeral 40c is a camera, and is held by work head 30.

Component Supply Device

Figure 4:
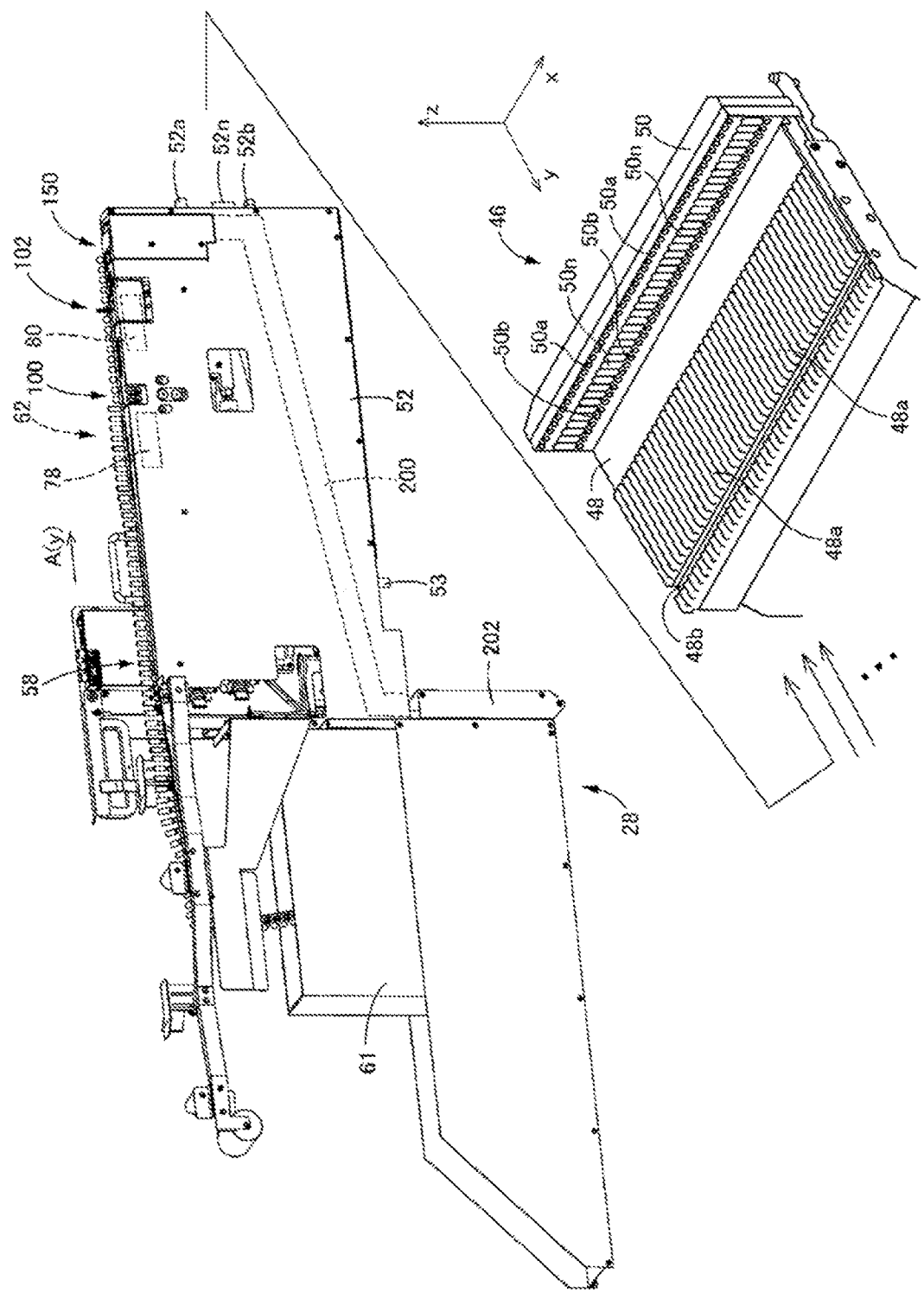
FIG. 4 is a perspective view of the tape feeder.

In component supply device 16, multiple tape feeders 28 are held by feeder holding member 46 illustrated in FIG. 4.

Feeder holding member 46 includes holding table 48 that holds tape feeders 28, and a positioning plate 50 which performs positioning of the tape feeder 28. On holding table 48, multiple holding grooves 48a that extend parallel to each other, and engaging groove 48b that extends in the direction orthogonal to a holding grooves 48a, are provided. On positioning plate 50, positioning recessed sections 50a and 50b that correspond to each of the holding grooves 48a are provided two by two, and connector connection sections 50n are provided. Feeder holding member 46 is attached to assembly apparatus main body (main body of the component supply device) 10 in a posture in which holding groove 48a extends in the y-direction and positioning plate 50 is substantially parallel to the xz plane, and feeder holding member 46 and assembly apparatus main body 10 are electrically connected to each other.

Tape feeder 28 includes two positioning protruding sections 52a and 52b and connector 52n that are provided on an end surface of feeder main body 52 that forms a longitudinal shape, and engaging protruding section 53 that can be moved to a protrusion position at which it protrudes from a lower surface of the feeder main body 52 and to a retraction position at which it does not protrude, by an operation device that is not illustrated.

Tape feeder 28 is held by holding groove 48a in a posture in which positioning protruding sections 52a and 52b are fitted to positioning recessed sections 50a and 50b of feeder holding member 46 and connector 52n is fitted to connector connection section 50n. In addition, engaging protruding section 53 is moved to the protrusion position, and is engaged with engaging groove 48b. In this manner, tape feeder 28 is attached to assembly apparatus main body 10 in a posture in which the longitudinal direction of feeder main body 52 is the y-direction. In addition, as connector 52n of tape feeder 28 and connector connection section 50n of feeder holding member 46 are connected to each other, tape feeder 28 and feeder holding member 46 are electrically connected to each other. According to this, tape feeder 28 and assembly apparatus main body 10 are electrically connected to each other.

In addition, there is also a case where feeder holding member 46 is provided on a wheeled table that can be attached to and detached from assembly apparatus main body 10.

Tape Feeder

Figure 5:
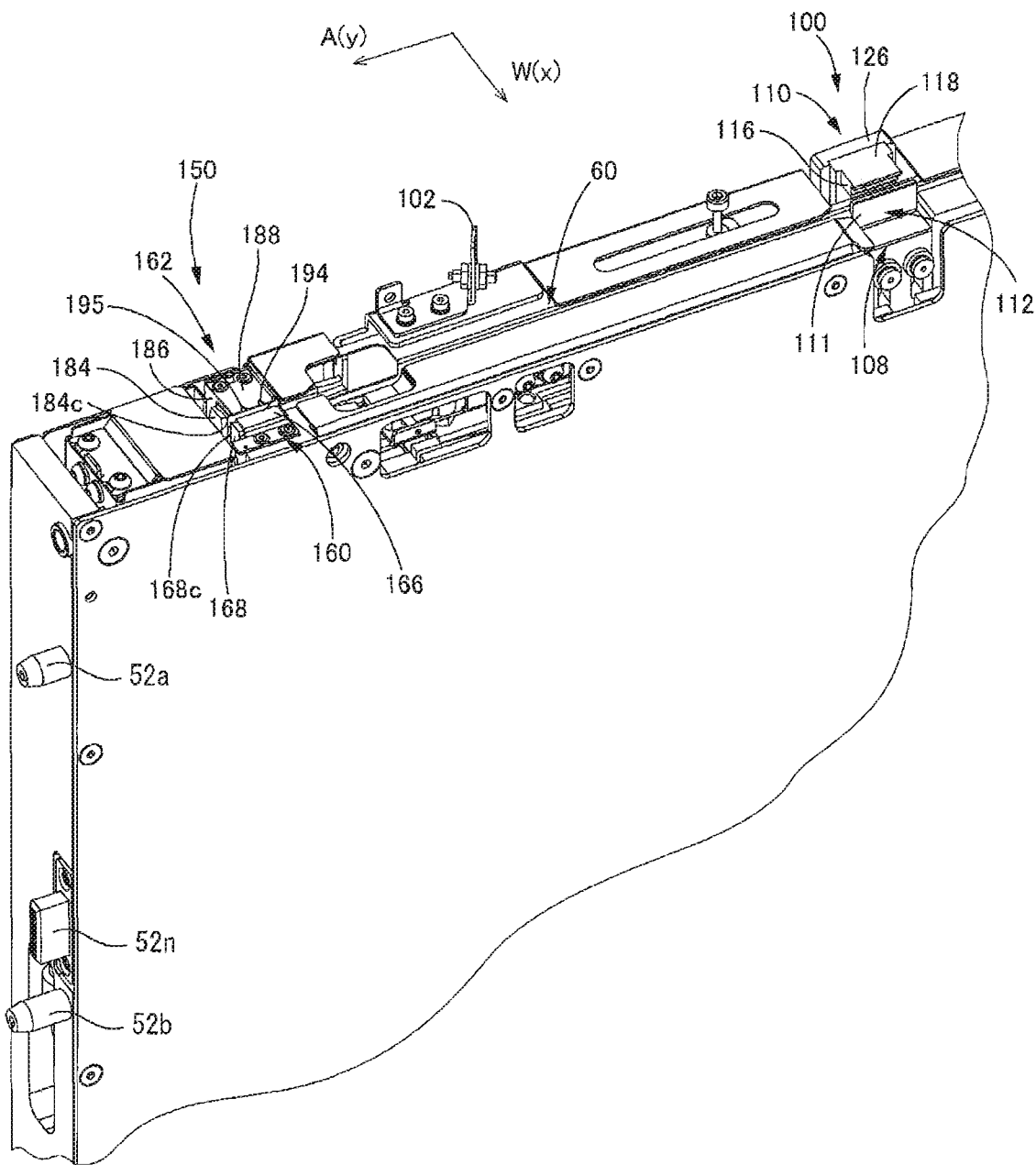
FIG. 5 is a perspective view (a portion) of the tape feeder.

Tape feeder 28 includes feeding device 62 or the like that feeds lead component tape 58 along a guide groove 60. As illustrated in FIG. 5, guide groove 60 is provided along the longitudinal direction on the upper surface of feeder main body 52, and the longitudinal direction of guide groove 60 is the feeding direction A of lead component tape 58. Feeding direction A is the y-direction of the electronic circuit assembly apparatus.

As illustrated in FIG. 9(a), lead component tape 58 is lead components held in tape, and includes multiple radial lead components 64, and carrier tape 65 that holds the radial lead components 64.

Radial lead component 64 is configured of two lead wires 66 and 67 that extend parallel to each other, and component main body 68; the multiple radial lead components 64 (hereinafter, simply referred to as lead components) are radially taped at each of the lead wires 66 and 67, and are considered the lead component tape 58. In carrier tape 65, feeding holes 70 are formed at a constant pitch along the longitudinal direction.

Feeding Device

Figure 6:
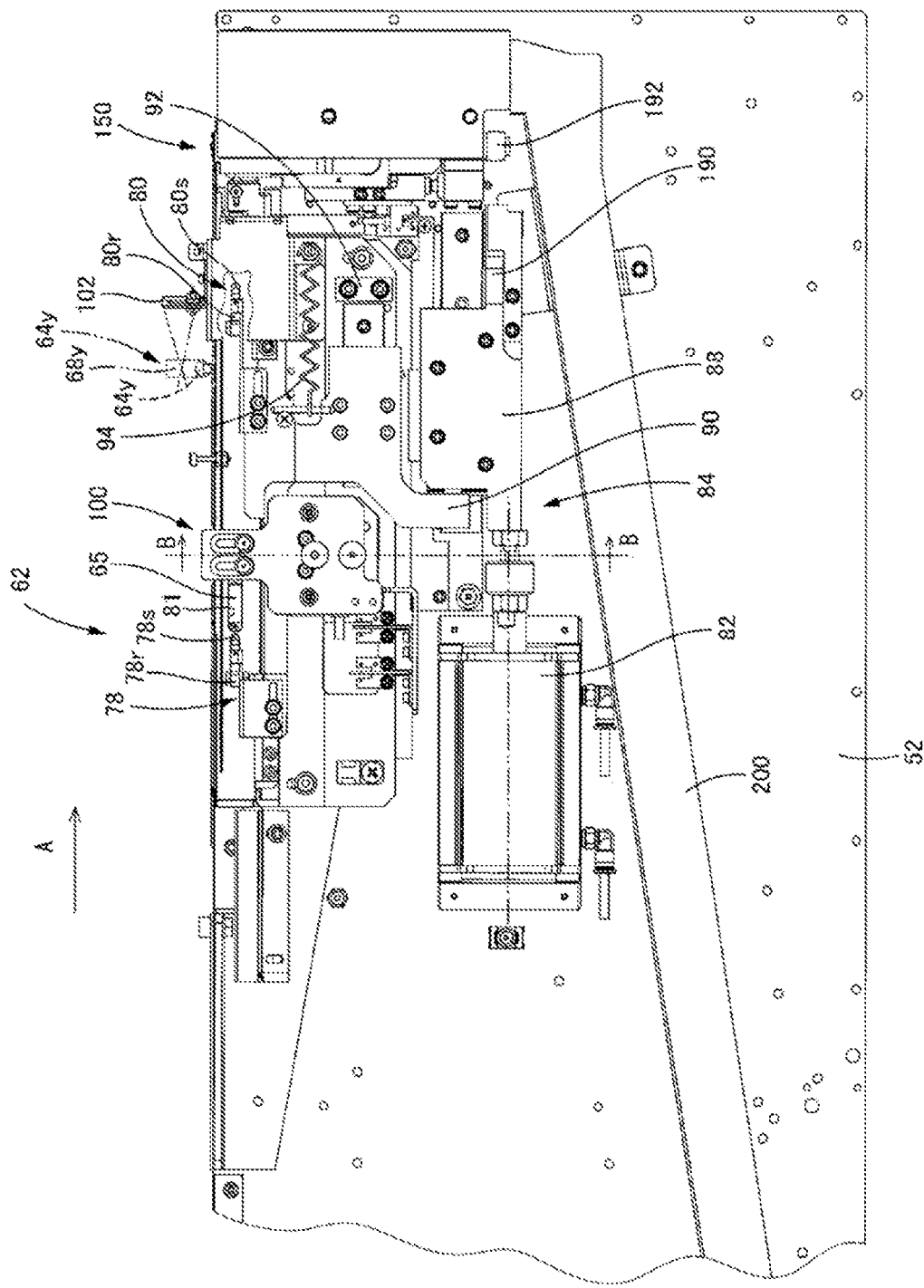
FIG. 6 is a front view of the tape feeder.

As illustrated in FIG. 6, feeding device 62 includes guide groove 60 and two feeding mechanisms 78 and 80.

Two feeding mechanisms 78 and 80 are separated from each other in the A direction, and feeding mechanism 78 is provided further on the upstream side than feeding mechanism 80. Feeding mechanisms 78 and 80 respectively include feeding rods 78r and 80r provided with feeding claws 78s and 80s that can be engaged with feeding hole 70 of carrier tape 65. Feeding mechanism 78 is provided at a position at which feeding claw 78s can be engaged with feeding hole 70 of carrier tape 65, in opening 81 formed on a side surface of guide groove 60. Regarding feeding mechanism 80, similarly, in the opening on the side surface of guide groove 60, or at a portion except for the side surface, feeding mechanism 80 is provided at a position at which feeding claw 80s can be engaged with feeding hole 70.

In both of the two feeding mechanisms 78 and 80, air cylinder 82 that serves as a driving source, and driving transmission section 84 that transmits the driving of air cylinder 82 to feeding mechanisms 78 and 80, are provided. Air cylinder 82 is fixed to feeder main body 52 in a posture in which a shaft line thereof extends in the A direction. Driving transmission section 84 includes a first driving transmission member 88 that is held to be movable integrally with a piston rod of air cylinder 82, and a second driving transmission member 90 which is elastically (for example, via a spring or the like) engaged with the first driving transmission member 88, and feeding rods 78r and 80r are held to be integrally movable with the second driving transmission member 90. Until the second driving transmission member 90 abuts against stopper 92, the second driving transmission member 90 advances following the movement (hereinafter, referred to as advancement in some cases) toward the downstream side of the first driving transmission member 88. However, after the second driving transmission member 90 abuts against stopper 92, the first driving transmission member 88 can advance relatively with respect to the second driving transmission member 90.

In addition, return spring 94 is provided between the second driving transmission section 90 and feeder main body 52.

By driving air cylinder 82, the first driving transmission member 88 advances, and according to this, the second driving transmission member 90 advances against an elastic force of return spring 94. Accordingly, each of the feeding claws 78s and 80s is engaged with the opposing feeding holes 70 of carrier tape 65, feeding rods 78r and 80r advance, and carrier tape 65 is fed one pitch. In addition, after the second driving transmission member 90 abuts against stopper 92, the second driving transmission member 90 is moved (hereinafter, referred to as moving and retreating to the upstream side in some cases) to the upstream side by return spring 94, and accordingly, feeding rods 78r and 80r retreat. However, by a separating mechanism which is not illustrated, feeding claws 78s and 80s are removed from feeding holes 70. In addition, by a tape pressing mechanism which is not illustrated, carrier tape 65 is prevented from floating up. Hereinafter, as reciprocating movement of feeding rods 78r and 80r in the A direction is repeatedly performed, carrier tape 65, that is, the lead component tape 58, advances one pitch at a time.

Tape feeder 28 includes bending device 100 provided between feeding mechanism 78 and feeding mechanism 80. In other words, feeding mechanism 78 is provided further on the upstream side than bending device 100, and feeding mechanism 80 is provided further on the downstream side. In addition, inspection device 102 is provided on the downstream side of bending device 100.

Bending Device

Figure 7A:
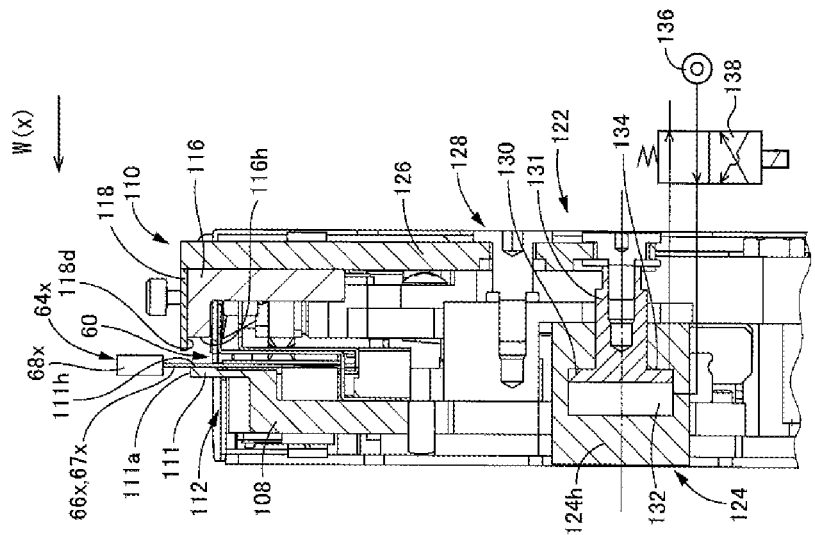
FIG. 7 is a sectional view taken along line B-B of FIG. 6.

As illustrated in FIGS. 5 and 7(a), bending device 100 bends lead wires 66x and 67x of a bending target lead component 64x that is lead component 64, in the lead component tape 58 fed by the feeding device 62, that has reached a bending position, in a substantial L shape.

Bending device 100 includes fixing section 108 that is fixedly provided on one side of guide groove 60 of feeder main body 52, and a movable section 110 that is provided on the other side of guide groove 60 at a position which opposes fixing section 108 to be capable of approaching and being separated from fixing section 108.

Fixing block 108 that serves as the fixing section 108 has a stepped shape in which a portion close to guide groove 60 is higher than a portion far from guide groove 60. The portion close to guide groove 60 of fixing block 108 is considered fixing side holding section 111 that protrudes further above the upper surface (an opening surface of guide groove 60, similarly called in the following) of feeder main body 52, and the portion far from guide groove 60 is lower than upper surface 111a of fixing side holding section 111, and is considered component main body accommodating portion 112. In fixing side holding section 111, fixing side opposing surface 111h that opposes guide groove 60 is a fixing side holding surface, and upper surface 11a is a fixing side receiving surface.

Movable section 110 includes (i) movable block 116 that serves as a movable side holding member, and (ii) forming plate 118 which serves as a bending member. Forming plate 118 is held in a state of protruding toward guide groove 60 on the upper surface of movable holding block 116.

Movable block 116 can move in the direction orthogonal to the A direction along the upper surface of feeder main body 52 (W direction of FIGS. 5 and 7), that is, in the width direction of guide groove 60 (feeder main body 52), and movable side opposing surface 116h that opposes guide groove 60 of the movable block 116 is considered a movable side holding surface.

Figure 7B:
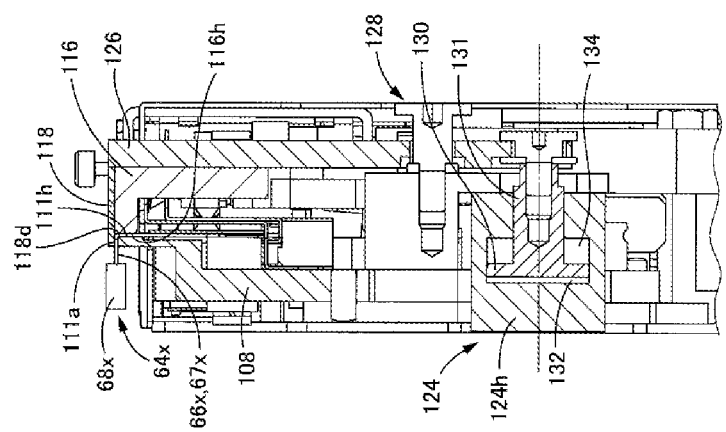
Figure 7C:
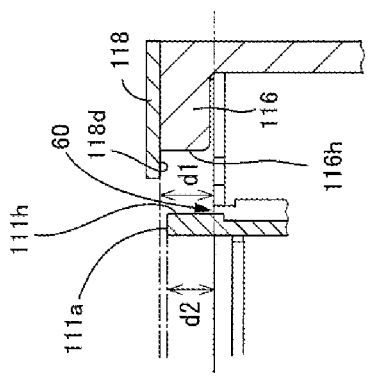

As illustrated in FIG. 7 (c), height d1 from the upper surface of feeder main body 52 of movable side holding surface 116h is slightly higher than height d2 from the upper surface of feeder main body 52 of fixing side holding surface 111h (d1 d2). As a result, the height from the upper surface of feeder main body 52 to bent surface 118d that is the lower surface of forming plate 118 is slightly higher than the height to fixing side receiving surface 11a.

Fixing side holding surface 111h and movable side holding surface 116h are parallel to each other, and fixing side receiving surface 11a and bent surface 119d are parallel to each other. In addition, fixing side holding surface 111h and fixing side receiving surface 111a are adjacent to each other, and an angle made by the two surfaces 111h and 111a is substantially a right angle. Furthermore, movable side holding surface 116h and bent surface 118d are adjacent to each other, and an angle made by the two surfaces 116h and 118d is substantially a right angle.

Bending device 100 includes driving device 122 that moves movable section 110 in the W direction. Driving device 122 includes (i) cylinder 124 that serves as a driving source, and (ii) driving plate 126 that serves as a driving member. Movable section 110 is held on driving plate 126 to be movable integrally.

Cylinder main body 124h of cylinder 124 is fixed to feeder main body 52 in a posture in which a shaft line thereof extends in the W direction. Cylinder 124 includes piston 130 and piston rod 131 which are fitted to cylinder main body 124h to be slidable, and movable plate 126 is held on piston rod 131 to be movable integrally in the shaft direction. In addition, driving plate 126 is held on the feeder main body 52 to be movable in the W direction, and movement of movable plate 126 in the W direction (x-direction) is guided by guide mechanism 128 provided between movable plate 126 and feeder main body 52.

In addition, a cylinder bore of cylinder 124 is divided into two pressure chambers 132 and 134 by piston 130. Electromagnetic valve (direction switching valve) 138 is provided between pressure chambers 132 and 134, and air supply source 136 that supplies high pressure air and the atmosphere. Direction switching valve 138 is switched to and from (i) a first position at which pressure chamber 132 (pressure chamber on the large diameter side of piston 130) is connected to air supply source 136, and pressure chamber 134 (pressure chamber on the piston rod 131 side of piston 130) is connected to the atmosphere, and (ii) a second position at which pressure chamber 132 is connected to the atmosphere, and pressure chamber 134 is connected to air supply source 136.

At the first position, by moving driving plate 126 away from guide groove 60, movable section 110 is separated from fixing section 108, and bending device 100 is in a non-operating state as illustrated in FIG. 7(a). At the second position, by moving driving plate 126 toward guide groove 60, movable section 110 approaches fixing section 108, and bending device 100 is in an operating state as illustrated in FIG. 7(b).

When bending device 100 is in the operating state, lead wires 66x and 67x of the bending target lead component 64x are held by fixing side holding surface 111h and movable side holding surface 116h, and are bent by fixing side receiving surface 11a and bent surface 118d of forming plate 118. In other words, at a portion that extends in the vertical direction (z-direction) protruding from the opening surface of guide groove 60 of lead wires 66x and 67x, lead wires 66x and 67x are held by fixing side holding surface 111h and movable side holding surface 116h, and at a portion on the component main body 68 side of the held portion, lead wires 66x and 67x are bent at a substantially right angle in the width direction (W direction) of feeder main body 52 by fixing side receiving surface 11a and bent surface 118d. The bent parts of lead wires 66 and 67 are referred to as curved sections 66m and 67m. In addition, in a state where the lead wires 66x and 67x are bent, component main body 68 is accommodated in component main body accommodating portion 112.

Inspection Device

As illustrated in FIG. 6, inspection device 102 inspects whether bending device 100, or the lead wire of an inspection target lead component 64y which is the lead component that has reached an inspection position which is determined in advance on the downstream side of bending device 100, is bent. Inspection device 102 may use, for example, a limited reflection type optical sensor that detects the presence of an object, for example, based on whether reflected light of light irradiated from an irradiation section is received in a light receiving section. In a case where the light irradiated toward the inspection target lead component 64y is not reflected, it can be ascertained that an object is not present at the irradiated portion (a portion at which component main body 68y is present if the lead wire of the inspection target lead component 64y is not bent), that is, that the lead wire illustrated by a dotted line is in a bent state. Meanwhile, in a case where the irradiated light is reflected and received in the light receiving section, it can be ascertained that the inspection target lead component 64y is in a standing state as illustrated by a two-dot chain line, that is, that the lead wire is not bent.

In addition, inspection device 102 may include a pressure switch. For example, as lead wires 66x and 67x of the bending target lead component 64x are bent, component main body 68 switches from off to on when component main body 68 is accommodated in component main body accommodating portion 112.

Cutting Device

Tape feeder 28 includes cutting device 150 that is provided further on the downstream side than inspection device 102. Cutting device 150 cuts lead wires 66z and 67z of cutting target lead component 64z which is a lead component of the lead component tape 58 fed by feeding device 62 that has reached a cutting position, and cuts carrier tape 65. In addition, cutting device 150 is operated by air cylinder 82 of feeding device 62, and cuts the lead wires 66z and 67z and cuts the carrier tape 65 as lead component tape 58 is fed.

As illustrated in FIGS. 5 and 8, cutting device 150 includes fixing section 160 that is fixedly provided on one side of guide groove 60 of feeder main body 52, and movable section 162 that is provided on the other side of the guide groove 60 at a position which opposes fixing section 160 to be capable of approaching and being separated from fixing section 160. In addition, most of fixing section 160 and movable section 162 is provided in a state of being positioned below the upper surface of feeder main body 52.

Fixing section 160 includes a fixing side lead cutter holding member 166 and a fixing side tape cutter holding member 168 that are fixedly provided being aligned in the A direction. The fixing side tape cutter holding member 168 is positioned further on the downstream side than the fixing side lead cutter holding member 166.

An upper portion (end portion on the opening side) of the fixing side lead cutter holding member 166 protrudes toward guide groove 60, opposing surface 166h which opposes guide groove 60 of the protruded part is considered a fixing side lead holding section, and lower edge (edge which extends in the A direction) 166c of opposing surface 166h is considered a fixing side lead cutter.

Edge line 168c that extends in the vertical direction (z-direction) formed of the end surface on the downstream side of the fixing side tape cutter holding member 168 and the opposing surface that opposes guide groove 60, is considered a fixing side tape cutter.

Movable section 162 includes (i) movable section main body 180 provided on feeder main body 52 to be rotatable, (ii) a movable side lead cutter holding member 182 and a movable side tape cutter holding member 184 that are held on the movable section main body 180 to be rotatable integrally, (iii) a movable side lead holding member 186 provided on movable section main body 180 to be relatively rotatable, and (iv) a positioning plate 188 held on the movable side lead holding member 186 to be rotatable integrally. The movable side tape cutter holding member 184 is provided further on the downstream side than the movable side lead cutter holding member 182.

As illustrated in FIG. 6, the movable section main body 180 includes cam surface 190 provided in the end portion on the advancing side of the first driving transmission member 88 operated by air cylinder 82, and an engageable engaging section 192. When cam surface 190 and engaging section 192 are engaged with each other following the advancement of the first driving transmission member 88, movable section main body 180 is rotated, and a rotating angle increases as a forward stroke of the first driving transmission member 88 increases.

As illustrated in FIG. 5, positioning plate 188 includes two recessed sections 194 and 195 provided to have a gap in the A direction. The size and the interval of the two recessed sections 194 and 195 correspond to the diameter and the interval of lead wires 66z and 67z of cutting target lead component 64z. In other words, positioning plate 188 can be attached to and detached from movable side lead holding member 186, and is changed in accordance with the shape (diameter and interval of two lead wires 66z and 67z) of cutting target lead component 64z.

The movable side lead holding member 186 is substantially L-shaped and has a portion that extends in the vertical direction of feeder main body 52 and a portion that extends in the width direction, end surface 186h of which opposes guide groove 60 and is considered a movable side lead holding section.

In addition, tip end edge (edge which extends in the A direction) 182c on the guide groove side of the movable side lead cutter holding member 182 is considered a movable side lead cutter, and movable lead cutter 182c is positioned below the upper surface of feeder main body 52, and below movable lead holding section 186h as illustrated in FIG. 8(a).

In addition, opposing surface 184h, which opposes the guide groove 60 of the movable side tape cutter holding member 184, is inclined, and edge (edge that extends in the vertical direction) 184c on the upstream side that protrudes the most is considered a movable side tape cutter.

At a retreating end position of the first driving transmission member 88, cutting device 150 is in a state illustrated in FIG. 8(a).

By operation of air cylinder 82, the first driving transmission member 88 advances, the second driving transmission member 90 advances, and carrier tape 65 is fed one pitch. After the second driving transmission member 90 abuts against stopper 92, the first driving transmission member 88 relatively advances to the second driving transmission member 90 by operation of air cylinder 82, and movable section main body 180 is rotated as cam surface 190 and engaging section 192 are engaged with each other.

As illustrated in FIG. 8(b), by the rotation of the movable side lead holding member 186 following the rotation of movable section main body 180, and by the cooperation of the movable side lead holding section 186h and the fixing side lead holding section 166h, a portion of lead wires 66z and 67z of cutting target lead component 64z on the carrier tape side of curved sections 66m and 67m is held. In addition, as two lead wires 66z and 67z are held by positioning plate 188, the positioning of cutting target lead component 64z is excellently performed. Since the movable side lead holding member 188 abuts against the fixing side lead holding section 166h via lead wires 66z and 67z, positioning plate 188 does not rotate more than that.

As illustrated in FIG. 8(c), movable section main body 180 is rotated relatively with respect to the movable side lead holding member 186 as the first driving transmission member 88 advances. The movable side lead cutter 182c cooperates with the fixing side lead cutter 166c, cuts a portion of lead wires 66z and 67z further to the carrier tape side than a portion held by the fixing side and movable side lead holding sections 166h and 186h, and separates cutting target lead component 64z from carrier tape 65. Bent lead components 64c that are cut at the portion of lead wires 66z and 67z on the carrier tape side of curved sections 66m and 67m are supplied consecutively one by one. In this manner, since lead wires 66z and 67z are cut in a positioned and held state, bent lead components 64c are supplied consecutively to a component supply position determined in advance.

In addition, by the cooperation of the movable side tape cutter 184c and the fixing side tape cutter 168c, carrier tape 65 is cut further on the downstream side than the cutting position of lead wires 66z and 67z. In other words, a portion of carrier tape 65, in which were taped lead wires 66z and 67z which were just cut, is cut, and the cut piece of carrier tape 65 is accommodated in dust box 202 (refer to FIG. 4) via dust passage 200.

In this manner, with this embodiment, lead wire cutting device 210 is configured from the fixing side lead holding section 166h, the movable side lead holding section 186h, the fixing side lead cutter 166c, the movable side lead cutter 186c, air cylinder 82, the first driving transmission member 88, cam surface 190, and engaging section 192; and tape cutting device 212 is configured from the fixing side tape cutter 168c and the movable side tape cutter 184c. In addition, a holding section is configured from the fixing side lead holding section 166h and the movable side lead holding section 186h, and a cutting section is configured from the fixing side lead cutter 166c and the movable side lead cutter 186c.

In addition, as illustrated in FIG. 1, the electronic circuit assembly apparatus is controlled based on commands of main control device (can be referred to as a main body side control device) 240 that has a computer as a main body. Various sensors (not illustrated) provided in the electronic circuit assembly apparatus are connected to main control device 240, and various actuators (not illustrated) included in board conveying and holding device 14 and component insertion device 20 are connected to main control device 240. In addition, feeder side control device 242 is connected to main control device 240 via feeder holding device 46, and communication between main control device 240 and the feeder side control device 242 is possible.

The feeder side control device 242 has a computer as a main body, and manual operation section (for example, with one or more switches included) 244 and electromagnetic valve 138 are connected to the feeder side control device 242. One switch included in manual operation section 244 is, for example, provided in feeder main body 52, and may be a changeover switch that is used for changeover from a case where straight line-like lead components are supplied to a case where bent lead components are supplied. The feeder side control device 242 controls electromagnetic valve 138 (bending device 100) and feeding device 62 or the like in accordance with commands from main control device 240 and operation of the changeover switch.

In addition, the control device (device side control device) provided separately in each of board conveying and holding device 14 and component insertion device 20 may be connected to main control device 240. In this case, commands of main control device 240 are received in the device side control device, and in accordance with this, each actuator or the like is controlled.

Operation in Electronic Circuit Assembly Apparatus

Lead component tape 58 is fed from lead component tape accommodation section 61, and further, drawn out along guide groove 60. Regarding lead component tape 58, as illustrated in FIG. 9(a), since blank tape section 250 that does not hold lead components 64 is provided in an end portion of carrier tape 65, lead component tape 58 sent out of lead component tape accommodation section 61 extends until the end portion reaches feeding mechanism 80, and feeding hole 70 is engaged with feeding claw 80s. In addition, when feeding device 62 is operated by driving of air cylinder 82, lead component tape 58 is fed in the A direction one pitch at a time.

Bending device 100 bends lead wires 66x and 67x of bending target lead component 64x, cutting device 150 cuts lead wires 66z and 67z of cutting target lead component 64z, and according to this, bent lead components 64c are supplied one by one. In this embodiment, the cutting position is the same as the component supply position.

As illustrated in FIG. 10(a), supplied bent lead component 64c is gripped by chuck 40 at lead wires 66c and 67c, and moved to a predetermined position of board P, and lead wires 66c and 67c are inserted into openings. In tape feeder 28, since bent lead components 64c are supplied to the component supply position in a state of being positioned with high accuracy, the bent lead components 64c can be excellently gripped by chuck 40. After this, as illustrated in FIG. 10(b), a portion of lead wires 66c and 67c that protrudes below board P is cut and clinched by a cut and clinch device that is not illustrated, such that bent lead component 64c is mounted on board P.

With this embodiment, in a case of gripping bent lead component 64c which is at the component supply position, chuck 40 approaches bent lead component 64c from the side opposite to component main body 68c (outer side of curved sections 66c and 67), from the arrow T direction (inclined direction of the x-direction) illustrated in FIG. 8(c), by oscillation, and grips lead wires 66c and 67c.

(A) In this manner, bent lead component 64c is gripped by chuck 40 from the side opposite to component main body 68c. Therefore, the portion further on the tip end side than curved sections 66m and 67m of lead wires 66c and 67c is short, and even in a case where a gap dp illustrated in FIG. 10(a) is small, auxiliary plate 43 can be suitably inserted in between lead wires 66c and 67c. In other words, after lead wires 66c and 67c of bent lead component 64c are inserted into board P, the gripping strength of lead wires 66c and 67c is loosened, and component main body 68c is pushed from above by pusher 44. However, here, in a case where the components are gripped from the component main body side, and in a case where the components are gripped from the y-direction, since claws 42a and 42b or auxiliary plate 43 interfere with component main body 68c, there is a case where component main body 68c cannot be pushed by pusher 44. In contrast, when the components are gripped from the side opposite to component main body 68c by claws 42a and 42b and auxiliary plate 43, component main body 68c can be pushed by pusher 44 in a state where lead wires 66c and 67c are gripped by claws 42a and 42b and auxiliary plate 43. Therefore, in a posture in which the bent lead component 64c is stabilized, it is possible to suitably mount the component on board P.

(B) When gripping bent lead component 64c, chuck 40 enters in the direction of arrow T (from above the inclination of the x-direction) of FIG. 8(c). Therefore, compared to a case where chuck 40 enters from the horizontal direction (x-direction), a space in the x-direction which is necessary for the movement of chuck 40 may be narrow. As a result, it is possible to place tape feeders 28 without a gap in holding grooves 48a formed in feeder holding member 46, and thus it is possible to hold many tape feeders 28 on feeder holding member 46.

In addition, in a case where chuck 40 enters from above the inclination of the x-direction, compared to a case where the chuck 40 enters horizontally from the y-direction, the gap in the y-direction may be narrow. As a result, even in a case of lead component tape in which an attaching pitch of the lead components held by the carrier tape is small, the components can be used in tape feeder 28.

(C) Auxiliary plate 43 is inserted in between the two lead wires 66c and 67c, one pair of claws 42a and 42b approach each other from the outside of lead wires 66c and 67c, and according to this, lead wires 66c and 67c are gripped respectively from the inside and outside. As a result, it is possible to suitably grip bent lead component 64c in a state of stabilized posture.

In addition, in a case where the blank tape section is not provided in the end portion on the start side of carrier tape 65 similar to lead component tape 252 illustrated in FIG. 9(b), lead component tape 252 which is sent out of lead component tape accommodation section 61 is drawn out along guide groove 60, and feeding hole 70 is engaged with feeding claw 78s of feeding mechanism 78. After this, lead component tape 58 is fed by feeding device 62. Hereinafter, similarly, bent lead components 64c are supplied one by one.

In this manner, with this embodiment, bending device 100 is provided in tape feeder 28. As a result, lead wires 66 and 67 of lead component 64 of lead component tape 58 are bent in tape feeder 28, and it is possible to easily supply bent lead components 64c. In other words, bent lead components 64c can be supplied just by attaching lead component tape 58 to tape feeder 28. In other words, compared to a case where lead component tape 58 is attached to a forming machine and supplied bent lead components 64c are moved to a tray or the like, it is possible to reduce the number of work processes in the entire automatic assembly of the electronic circuit.

In addition, for example, in a case where the lead wire of lead component 64 is long and the height of the protrusion from feeder main body 52 of tape feeder 28 is high, when the lead wire is bent in tape feeder 28, it is possible to lower the height of lead component 64 which protrudes from feeder main body 52 further on the downstream side than bending device 100, and to that extent, it is possible to install tape feeder 28 in a narrow space.

Furthermore, in bending device 100, since lead wires 66x and 67x of the bending target lead component 64x are bent along the fixing side opposing surface 111h and the upper surface 111a, compared to the bending devices according to PTL 1 and PTL 2, it is possible to suitably curve lead wires 66x and 67x in an L shape.

In addition, in a case where a changeover command to a straight line-like lead component is received from main control device 240 in feeder side control device 242, and in a case where a changeover operation from bent lead components to straight line-like lead components is performed, electromagnetic valve 138 that is a direction switching valve is held in a non-excited state (held at the first position), and bending device 100 is maintained in a non-excited state. Lead wires 66 and 67 of lead component 64 of lead component tape 58 sent along guide groove 60 are not bent. The lead components that are separated from carrier tape 65 by cutting device 150, and in which lead wires 66 and 67 have a shape of a straight line, are supplied in order. In this manner, the tape feeder can be used both for supplying bent lead components 64c and for supplying lead components with straight line-like lead wires.

In addition, the shape of tape feeder 28 and the shape of the lead component tape are not limited to those in the embodiment. The shape of the lead component tape has various aspects determined by a standard. The width of the carrier tape, the pitch (attaching pitch) of the lead component held by the carrier tape, and the pitch of the feeding hole, vary in accordance with the type or the size of the lead component. In addition, tape feeder 28 also has various aspects in which the shape, such as the width or the size, of feeder main body 52, and specifications of the feeding device vary. Therefore, it is possible to appropriately select and use tape feeder 28 in accordance with the shape of the lead component tape, and even when the shape of the lead component tape varies, it is possible to easily supply bent lead components.

Meanwhile, in tape feeder 28, the feeding pitch is determined in advance by the structure or the like of the feeding mechanisms 78 and 80, but in a case where the attaching pitch of the lead component held by the carrier tape of the lead component tape is an integer multiple of a feeding pitch of feeding mechanisms 78 and 80, in tape feeder 28, as bending device 100 is operated by moving feeding claws 78s and 80s multiple times, it is possible to similarly supply bent lead components 64c.

In addition, in accordance with the type or the like of the board to be produced, by reloading the tape feeders attached to feeder holding member 46, and by performing changeover that increases or decreases the quantity of loaded tape feeders 28, multiple types of bent lead components that are required to produce the board are suitably supplied to electronic circuit assembly apparatus 10, and the board can be efficiently produced.

In addition, the structure of the tape feeder is not limited to the structure illustrated in the embodiment. For example, the feeding device can also be moved by a sprocket. In addition, it is possible to bend and cut the lead wires at the same position.

Furthermore, bending device 100 can be employed not in tape feeder 28, but in a forming machine. In addition, the present disclosure can be realized in an aspect in which various changes are made based on knowledge of those skilled in the art, for example, the lead component of lead component tape 58 may be an axial lead component.

REFERENCE SIGNS LIST

16: component supply device, 28: tape feeder, 40: chuck, 46: feeder holding device, 52: feeder main body, 58: lead component tape, 62: feeding device, 60: guide groove, 53: engaging protruding section, 52a, 52b: positioning protruding section, 64: lead component, 66, 67: lead wire, 78: first feeding mechanism, 78s: feeding claw, 82: cylinder, 100: bending device, 102: inspection device, 108: fixing section, 110: movable section, 111h: fixing side holding section, 111a: fixing side receiving surface, 116h: movable side holding section, 118: forming plate, 122: driving device, 124: cylinder, 138: direction switching valve, 150: cutting device

The invention claimed is:

1. A tape feeder, comprising:
a feeding device including a feeder main body that includes a guide groove configured to guide and supply a lead component tape holding a lead component;
a bending device configured to bend multiple lead wires of the lead component that has reached a bending position, as the lead component tape is fed by the feeding device; and
a cutting device configured to cut the multiple lead wires of the lead component that has reached a cutting position, as the lead component tape is fed by the feeding device,
wherein the bending device includes a movable section above an upper surface of the feeder main body, and a fixing section fixed relative to the movable section,
wherein the cutting device includes a cutting section below the upper surface of the feeder main body configured to cut each of the multiple lead wires of the lead component, and a holding section configured to hold the multiple lead wires of the lead component, at least a portion of the holding section being above the cutting section,
wherein the fixing section is fixedly provided on a first side of the guide groove of the feeder main body, and the movable section is provided on a second side of the guide groove of the feeder main body to be capable of approaching and being separated from the fixing section,
wherein the fixing section includes (i) a fixing side opposing surface that opposes the guide groove, and (ii) a fixing side receiving surface that extends from the fixing side opposing surface away from the guide groove, and is inclined with respect to the fixing side opposing surface, and
wherein the movable section includes (a) a movable side opposing surface that opposes the fixing side opposing surface, and (b) a bent surface that extends parallel to the fixing receiving surface.

2. The tape feeder according to claim 1,
wherein the cutting position is positioned on a downstream side of the bending position.

3. The tape feeder according to claim 2,
wherein the movable section includes (i) a movable side holding member configured to hold the multiple lead wires of the lead component by gripping the lead wires together with the fixing section, and (ii) a bending member configured to bend the multiple lead wires of the bending target lead component at a portion opposing the movable side holding member, along the fixing section.

4. The tape feeder according to claim 3, further comprising:
an inspection device configured to inspect whether the multiple lead wires of the lead component are bent, as the lead component tape is fed by the feeding device.

5. The tape feeder according to claim 4,
wherein the feeding device includes two feeding mechanisms that are respectively provided upstream and downstream of the bending position, and the two feeding mechanisms respectively include one feeding claw.

6. The tape feeder according to claim 2, further comprising:
an inspection device configured to inspect whether the multiple lead wires of the lead component are bent, as the lead component tape is fed by the feeding device.

7. The tape feeder according to claim 1,
wherein the movable section includes (i) a movable side holding member configured to hold the multiple lead wires of the lead component by gripping the lead wires together with the fixing section, and (ii) a bending member configured to bend the multiple lead wires of the bending target lead component at a portion opposing the movable side holding member, along the fixing section.

8. The tape feeder according to claim 7, further comprising:
an inspection device configured to inspect whether the multiple lead wires of the lead component are bent, as the lead component tape is fed by the feeding device.

9. The tape feeder according to claim 1, further comprising:
an inspection device configured to inspect whether the multiple lead wires of the lead component are bent, as the lead component tape is fed by the feeding device.

10. The tape feeder according to claim 9,
wherein the feeding device includes two feeding mechanisms that are respectively provided upstream and downstream of the bending position, and the two feeding mechanisms respectively include one feeding claw.

11. The tape feeder according to claim 1,
wherein the feeding device includes two feeding mechanisms that are respectively provided upstream and downstream of the bending position, and the two feeding mechanisms respectively include one feeding claw.

12. The tape feeder according to claim 1,
wherein the fixing section includes a fixing block presenting a stepped shape, a portion of the fixing block closer to the guide groove being a fixing side holding section that protrudes above the upper surface of the feeder main body, the fixing side opposing surface being provided on a surface of the fixing side holding section opposing the guide groove, and the fixing side receiving surface being an upper surface of the fixing side holding section, and
wherein the movable section includes a movable block, and a forming plate provided on an upper surface of the movable block and protruding toward the guide groove, the movable block being movable along a width direction of the guide groove, the movable side opposing surface being a surface of the movable block opposing the guide groove, and the bent surface being a lower surface of the forming plate.

13. The tape feeder according to claim 1,
wherein a height between the upper surface of the feeder body and the bent surface is greater than a height between the upper surface of the feeder body and the fixing side receiving surface.

* * * * *